US009065450B2

(12) United States Patent
Geynet et al.

(10) Patent No.: US 9,065,450 B2
(45) Date of Patent: Jun. 23, 2015

(54) INTEGRATED CIRCUIT DEVICE AND METHOD FOR GENERATING A TUNING SIGNAL FOR CALIBRATING A VOLTAGE CONTROLLED OSCILLATOR

(75) Inventors: Lionel Geynet, Fontenilles (FR); Jean-Stephane Vigier, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/635,006

(22) PCT Filed: Jun. 29, 2010

(86) PCT No.: PCT/IB2010/001937
§ 371 (c)(1),
(2), (4) Date: Sep. 14, 2012

(87) PCT Pub. No.: WO2012/001450
PCT Pub. Date: Jan. 5, 2012

(65) Prior Publication Data
US 2013/0147563 A1 Jun. 13, 2013

(51) Int. Cl.
*H03L 7/00* (2006.01)
*H03L 1/02* (2006.01)
(Continued)

(52) U.S. Cl.
CPC *H03L 7/00* (2013.01); *H03L 1/023* (2013.01); *H03B 5/04* (2013.01); *H03B 5/124* (2013.01); *H03L 1/00* (2013.01); *H03L 7/099* (2013.01); *H03L 7/10* (2013.01)

(58) Field of Classification Search
CPC .............. H03L 1/023; H03L 7/00; H03L 1/00; H03L 7/099; H03L 7/10; H03B 5/04; H03B 5/124

USPC ..... 331/36 C, 65, 117 R, 117 FE, 167, 177 V, 331/176, 185, 186, 16, 25, 34, 44; 327/156; 375/376

See application file for complete search history.

(56) References Cited

U.S. PATENT DOCUMENTS 5,955,929 A * 9/1999 Moon et al. ..................... 331/57
6,556,093 B2 4/2003 Craninckx et al.
(Continued)

FOREIGN PATENT DOCUMENTS

| JP | 2002-111455 A | 4/2002 |
|---|---|---|
| JP | 2006-270161 A | 10/2006 |
| JP | 2010-035098 A | 2/2010 |

OTHER PUBLICATIONS

Young I A et al: "A PLL Clock Generator with 5 to 110 MHz of Lock Range for Microprocessor", IEEE Journal of Solid-State Circuits, IEEE Service Center, Piscataway, NJ, USA, vol. 27, No. 11, Nov. 1, 1992, pp. 1599-1607.

(Continued)

*Primary Examiner* — Arnold Kinkead
*Assistant Examiner* — Richard Tan

(57) ABSTRACT

An integrated circuit device comprises tuning signal circuitry for generating a tuning signal for calibrating a voltage controlled oscillator (VCO). The tuning signal circuitry is arranged to receive a target voltage signal that is representative of a target voltage across at least one passive element within a resonant tank circuit of a VCO that is being calibrated, generate a VCO simulation signal representative of an average voltage difference across at least one active component of the VCO that is being calibrated, and output a tuning signal based at least partly on the received target voltage signal and the generated VCO simulation signal.

20 Claims, 3 Drawing Sheets

(51) Int. Cl.
*H03B 5/04* (2006.01)
*H03B 5/12* (2006.01)
*H03L 1/00* (2006.01)
*H03L 7/099* (2006.01)
*H03L 7/10* (2006.01)

(56) References Cited

U.S. PATENT DOCUMENTS

| | | |
|---|---|---|
| 7,099,643 B2 | 8/2006 | Lin |
| 7,109,815 B1 | 9/2006 | Groe et al. |
| 7,266,062 B2 * | 9/2007 | Kurihara ............... 369/47.44 |
| 7,443,252 B2 | 10/2008 | Tu et al. |
| 2010/0026406 A1 | 2/2010 | Fujiwara et al. |
| 2010/0085127 A1 | 4/2010 | Saurabh et al. |
| 2011/0063002 A1 * | 3/2011 | Liu ............................. 327/157 |

OTHER PUBLICATIONS

Louis-Frana PRG OIS Tanguay et al: "A 640 µW Frequency Synthesizer Dedicated to Implantable Medical Microsystems in 90-nm CMOS", NEWCAS Conference (NEWCAS), 2010 8th IEEE International, IEEE, Piscataway, NJ, USA, Jun. 20, 2010, pp. 369-372.
International Search Report and Written Opinion correlating to PCT/IB2010/001937 dated Apr. 4, 2011.

* cited by examiner

INTEGRATED CIRCUIT DEVICE AND METHOD FOR GENERATING A TUNING SIGNAL FOR CALIBRATING A VOLTAGE CONTROLLED OSCILLATOR

FIELD OF THE INVENTION

The field of this invention relates to an integrated circuit device comprising tuning signal circuitry for generating a tuning signal for calibrating a voltage controlled oscillator, and method therefor.

BACKGROUND OF THE INVENTION

Voltage Controlled Oscillators (VCOs) are often used to synthesize high frequency signals, and often form part of a Phase Locked Loop (PLL). FIG. 1 illustrates an example of a typical PLL 100. The PLL 100 comprises a VCO 110 arranged to receive a control voltage signal 105 and to output a synthesized frequency signal 115. The synthesized frequency signal 115 is provided to a feedback loop comprising a fractional 'N' divider 120 that is arranged to receive the synthesized frequency signal 115 and to output a feedback signal 125 comprising a frequency equal to an $N^{th}$ that of the synthesized frequency signal 115. The feedback signal 125 is then provided to a phase/frequency detector 130, which compares the feedback signal 125 to a reference signal 135, and outputs a comparison signal 145. The comparison signal 145 is then fed to, for example, a charge pump 140, which receives the comparison signal 145 and outputs the control voltage signal 105 provided to the VCO 110. The control voltage signal 105 may be passed through a low pass filter 150 before being provided to the VCO 110.

It is often necessary for a PLL, and in particular the VCO thereof, to be calibrated in order to ensure accurate generation of a desired frequency signal, for example when changing from one required synthesized frequency signal to another. Traditional techniques for automated calibration of a VCO typically comprise providing a tuning signal to VCO calibration logic (not shown), which compares a signal within the PLL, for example the control voltage signal provided to the VCO, to the tuning signal. The VCO calibration logic then calibrates the VCO such that the compared signal matches the received tuning signal. For example, such calibration may comprise initial 'coarse' tuning of the PLL, whereby a frequency range/sub-band is selected by configuring the fractional 'N' divider 120 within the feedback path of the PLL 100. Having selected a desired frequency range/sub-band, 'fine' calibration of the VCO 110 may be performed, for example by calibrating inductance and/or capacitance values within an LC resonance tank of the VCO 110.

One problem with traditional calibration techniques is that the tuning signal provided to the calibration logic is typically generated by an external component, such as a voltage divider or the like, where the tuning signal is referenced to ground. In this manner, such a tuning signal is substantially unaffected (or at least only slightly affected) by variations in process, temperature, current consumption, oscillation frequency, etc. However, VCOs are typically not so unaffected by variations in process, temperature, current consumption, oscillation frequency, etc. Accordingly, using such a 'reliable' tuning voltage signal to calibrate a VCO may result in the VCO being calibrated such that a sub-optimal frequency range/sub-band is selected, thereby resulting in a VCO gain value that causes the PLL not to lock during normal operation.

Thus, there is a need for enabling VCO calibration to be performed such that the correct frequency range/sub band may be obtained irrespective of variations in process, temperature, current consumption, oscillation frequency, etc.

SUMMARY OF THE INVENTION

The present invention provides an integrated circuit device comprising tuning signal circuitry for generating a tuning signal for calibrating a voltage controlled oscillator, and a method for generating a tuning signal for calibrating a voltage controlled oscillator, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
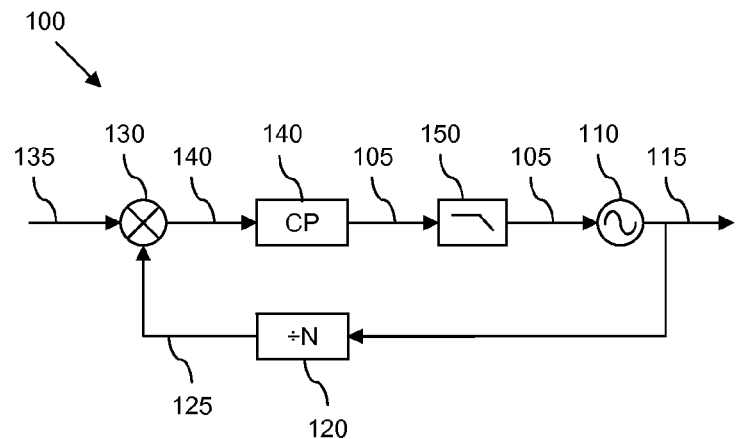
FIG. 1 illustrates a known example of a phase locked loop arrangement.
Figure 2:
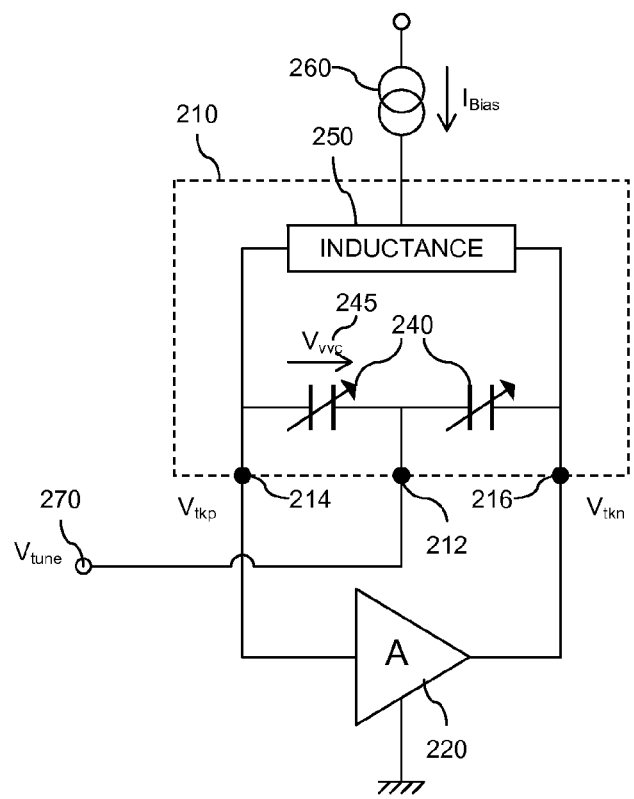
FIG. 2 illustrates an example of a voltage controlled oscillator.

Referring now to FIG. 2, there is illustrated an example of a voltage controlled oscillator (VCO) 200. The VCO 200 comprises a resonant tank circuit 210 arranged to oscillate a current at a resonant frequency of the tank circuit 210. As is typical with such resonant tank circuits, the resonant tank circuit 210 of FIG. 2 comprises various passive elements in the form of inductive and capacitive elements. For simplicity, the resonant tank circuit 210 of FIG. 2 is illustrated as comprising a variable capacitance 240 and an inductive element 250 operably coupled in parallel with the variable capacitance 240. However, any suitable arrangement of inductive and capacitive elements may be provided within the resonant tank circuit 210. The capacitive properties of the variable capacitance 240 may be 'tuned' by way of a control voltage ($V_{tune}$) 270 provided to an input 212 of the resonant tank circuit 210, and in this manner the resonant frequency of the tank circuit 210 may be controlled. The VCO 200 further comprises an amplifier component 220 arranged to provide sufficient gain to the oscillating current in order to replace energy lost in, for example the resonant tank circuit 210. The amplifier component 220 typically comprises active components, for example in a form of a transistor differential pair or the like. A current source 260 is operably coupled in series with the amplifier component 220, and arranged to provide a bias current to the tank circuit 210.

VCOs, such as the VCO 200 illustrated in FIG. 2, are often used to synthesize high frequency signals, and in particular often form part of a Phase Locked Loop (PLL). It is often necessary for a PLL, and in particular the VCO thereof, to be calibrated in order to ensure accurate generation of a desired frequency signal, for example when changing from one required synthesized frequency signal to another. Traditional techniques for automated calibration of a VCO typically comprise providing a tuning signal to the VCO. Calibration logic may then compare a signal within the PLL, for example a signal output by, say, a charge pump of the PLL, to a target value, and calibrate the VCO and/or PLL such that the compared signal matches the target value. For example, such calibration may comprise initial 'coarse' tuning of the PLL whereby a frequency range/sub-band is selected by configuring an N divider within a feedback path of the PLL. Having selected a desired frequency range/sub-band, 'fine' calibration of the VCO 200 may be performed by, say, calibrating inductance and/or capacitance values within the resonant tank circuit 210 of the VCO 200. For example, the resonant tank circuit 210 may comprise calibration inductance/capacitance components (not shown) that may be 'switched' in/out of the resonant tank circuit 210 to vary the inductive/capacitive properties thereof, and thereby to vary the resonant frequency of the tank circuit 210.

A problem with traditional techniques is that the tuning signal provided to the VCO is typically generated by an external component comprising passive elements such as a voltage divider or the like, where the tuning signal is referenced to ground. In this manner, such a tuning signal is substantially unaffected (or only very slightly affected) by variations in process, temperature, current consumption, oscillation frequency, etc. However, as illustrated in FIG. 2, VCOs comprise active elements within the amplifier component 220 thereof, and therefore can be significantly affected by variations in process, temperature, current consumption, oscillation frequency, etc. Accordingly, using such a 'reliable' tuning voltage signal to calibrate a VCO may result in the VCO being calibrated such that it comprises sub-optimal frequency range/sub-band tuning during normal operation, potentially resulting in a VCO gain value that causes the PLL not to lock.

Figure 3:
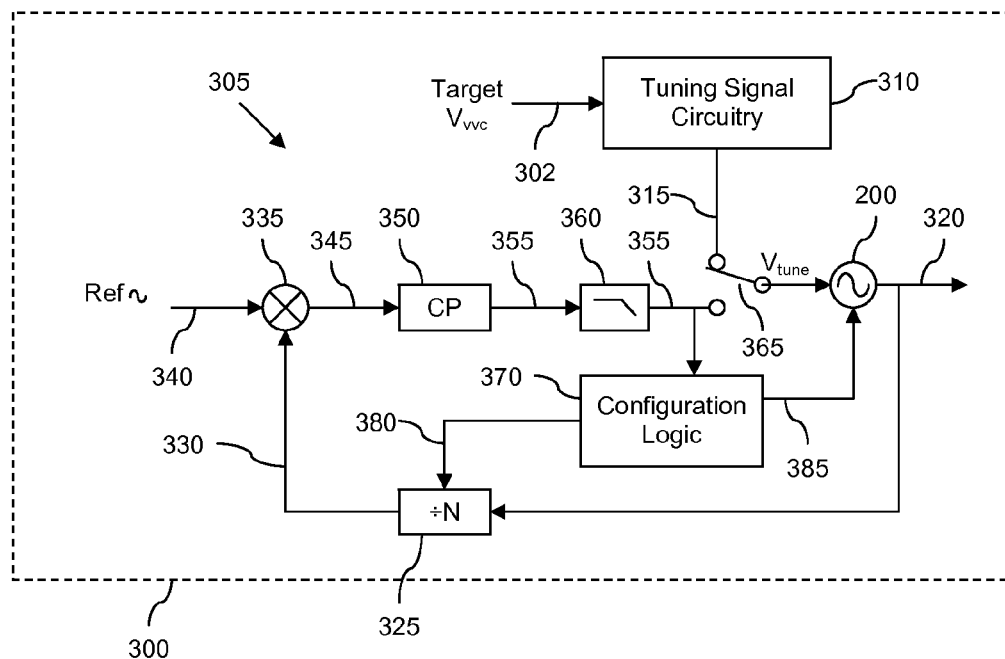
FIG. 3 illustrates an example of an integrated circuit device comprising tuning signal circuitry.

Referring now to FIG. 3, there is illustrated an example of an integrated circuit device 300 comprising tuning signal circuitry 310 for generating a tuning signal 315 for calibrating a VCO, such as the VCO 200 of FIG. 2. For the illustrated example, the VCO 200 forms a part of a PLL circuit 305, and, as such, a synthesized frequency signal 320 output by the VCO 200 is provided to a feedback path of the PLL circuit 305. The feedback path comprises a fractional 'N' divider 325 arranged to receive the synthesized frequency signal 320 and to output a feedback signal 330 comprising a frequency substantially equal to an $N^{th}$ that of the synthesized frequency signal 320. The feedback signal 330 is then provided to a phase/frequency detector 335, which compares the feedback signal 330 to a reference signal 340, and outputs a comparison signal 345. The comparison signal 345 is then fed to a charge pump 350, which receives the comparison signal 345 and outputs a control voltage signal 355 to be provided to the VCO 200 via a low pass filter 360. For the illustrated example, a switching element 365 is located between the low pass filter 360 and the VCO 200 and arranged to operably couple an input of the VCO 200. For the example illustrated in FIG. 2, the switching element 365 would be located at the input 212 of the resonant tank circuit 210. In a first normal PLL mode of operation (not shown), the switching element 365 couples the control voltage signal 355 from the low pass filter 360 to the VCO 200. The switching element 365 is further arranged to operably couple the input of the VCO 200 to the tuning signal 315 generated by the tuning signal circuitry 310 when in a second, PLL/VCO calibration configuration, as illustrated in FIG. 2.

Calibration logic 370 is also illustrated in FIG. 3, which for the illustrated example is arranged to receive the control voltage signal 355 from the low pass filter 360, during calibration of the PLL/VCO. During a calibration mode, the calibration logic 370 compares the control voltage signal 355 to a target value, for example stored within a register (not shown) of the calibration logic 370, and in response thereto calibrates the VCO 200 and/or PLL circuit 300 such that the control voltage signal 355 matches the target value. For example, such calibration may comprise initial 'coarse' tuning of the PLL circuit 305, whereby a frequency range/sub-band is selected by configuring the fractional 'N' divider 325 within a feedback path of the PLL circuit 305. Having selected a desired frequency range/sub-band, 'fine' calibration of the VCO 200 may be performed by, say, calibrating inductance and/or capacitance values within the resonant tank circuit 210 of the VCO 200 of FIG. 2.

The PLL circuit 305 and calibration logic 370 illustrated in FIG. 3 are only intended as providing an exemplary embodiment of an integrated circuit device adapted in accordance with an example of the present invention, to aid understanding of the inventive concept herein described. As such, the specific implementations of the PLL circuit 305 and calibration logic 370 illustrated in FIG. 3 are not intended to be limiting on the scope of the present invention. For example, the calibration logic may alternatively be arranged to receive the synthesized frequency signal 320, and during a calibration mode, to compare the synthesized frequency signal 320 to a target value/signal, and in response thereto to calibrate the VCO 200 and/or PLL circuit 300.

Figure 4:
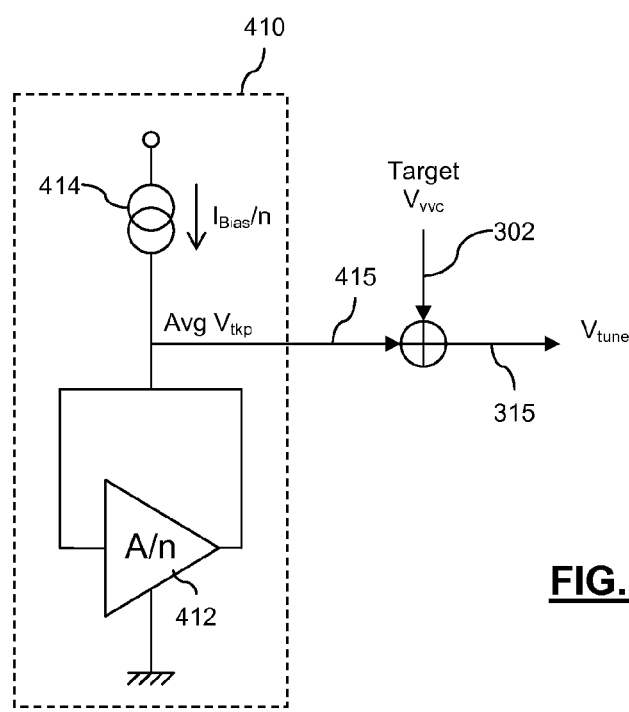
FIG. 4 illustrates an example of the tuning signal circuitry of FIG. 3.

Referring now to FIG. 4, in combination with aspects of FIG. 3, there is illustrated an example of the tuning signal circuitry 310 for generating a tuning signal 315 for calibrating a VCO according to some example embodiments. The tuning signal circuitry 310 is arranged to receive a target voltage signal 302 that is representative of a target voltage ($V_{vvc}$) across at least one passive element within the resonant tank circuit 210 of the VCO 200 that is to be calibrated. The tuning signal circuitry 310 is further arranged to generate a VCO simulation signal 415 that is representative of an average voltage difference (Avg $V_{tkp}$) across the at least one active component 220 of the VCO 200 that is/are being calibrated, and to output a tuning signal 315 based at least partly on the received target voltage signal 302 and the generated VCO simulation signal 415.

In this manner, the VCO simulation signal component of the tuning signal 315 enables the sensitivity of the at least one active component 220 of the VCO 200 to variations in process, temperature, current consumption, oscillation frequency, etc. to be reflected in the tuning signal 315, and thereby compensated for during calibration of the PLL/VCO. Conversely, the target voltage signal component of the tuning signal 315 provides a configurable reference voltage for at least one passive element within the resonant tank circuit 210 of the VCO 200 of FIG. 2 for use during calibration of the PLL/VCO, and which is not affected by variations in process, temperature, current consumption, oscillation frequency, etc. Thus, a tuning signal 315 may be generated that enables a PLL/VCO to be calibrated according to a configurable reference voltage, whilst variations in process, temperature, current consumption, oscillation frequency, etc. may also be reflected and at least partially compensated, therefor resulting in more accurate and reliable calibration of the VCO/PLL. As a result, the VCO/PLL may be more accurately calibrated, resulting in more efficient operation of the circuitry. Lower current consumption may be achieved as well as a reduction in the likelihood of sub-optimal frequency range/sub-band selection during calibration.

For prior art calibration techniques, where a PLL and VCO have been calibrated in order to achieve a target voltage $V_{vvc}$ across a tuning capacitance following a calibration of 460 mV, actual $V_{vvc}$ voltage levels have been measured as ranging from 391 mV to 530 mV following calibration. Such a variation in the voltage $V_{vvc}$ across a tuning capacitance may be sufficient to cause the PLL not to lock, or to degrade phase noise performance beyond acceptable levels. Conversely, following calibration using a tuning signal generated in accordance with examples of the present invention, $V_{vvc}$ voltage levels have only ranged from 453 mV to 475 mV following calibration, significantly more accurate than for prior art techniques.

By enabling variations in process to be at least partially compensated for during calibration of a PLL/VCO in this manner, a significantly improved yield for semiconductor devices that comprise such PLL/VCO circuits may be achieved. Furthermore, by enabling variations in process, temperature, current consumption, oscillation frequency, etc. to be at least partially compensated for during calibration of a PLL/VCO in the aforementioned manner, phase noise may be significantly reduced, thereby potentially enabling a wider frequency band to be achieved, allowing the number of required frequency sub-bands to be reduced, and/or simplifying calibration and operation of the PLL circuit.

Equation 1 below provides an expression for the gain of the VCO 200 illustrated in FIG. 2:

$$\text{VCOgain} = K_{vco} = f(V_{vvc}) \qquad \text{Equation 1}$$

Similarly, Equation 2 below provides an expression for the oscillation frequency of the VCO 200:

$$F_{osc} = \frac{1}{2*\pi\sqrt{L*C(V_{vvc})}} \qquad \text{Equation 2}$$

As shown in Equation 2, both the gain Kvco and oscillation frequency Fosc of the VCO 200 are directly affected by the voltage Vvvc 245 across the tuning capacitance 240, e.g. between the tuning input 212 of the tank circuit 210 and the output 214 of the resonant tank circuit 210. Since the tuning capacitance 240 is a purely passive component, the voltage Vwc 245 across the tuning capacitance 240 will not be affected by variations in process, temperature, current consumption, oscillation frequency, etc.

$$V_{vvc} = V_{tune} - \text{avg}(V_{tkp}) \qquad \text{Equation 3}$$

Equation 3 above illustrates the relationship of the voltage $V_{vvc}$ 245 across the tuning capacitance 240 with the control voltage ($V_{tune}$) 270 provided to the input 212 of the resonant tank circuit 210, and the voltage ($V_{tkp}$) at the output 214 of the resonant tank circuit 210. Thus, a control voltage ($V_{tune}$) 270 may be defined as the sum of the voltage $V_{vvc}$ 245 across the tuning capacitance 240 and the average voltage ($V_{tkp}$) at the output 214 of the resonant tank circuit 210. As illustrated in FIG. 2, the voltage ($V_{tkp}$) at the output 214 of the resonant tank circuit 210 is effectively the voltage across the amplifier component 220 of the VCO 220. Thus, for the example illustrated in FIG. 2, a control voltage ($V_{tune}$) 270, when applied to the VCO 200, is divided into a 'passive' voltage component across a part of the resonant tank circuit 210 of the VCO, and an 'active' voltage component across the amplifier component 220 of the VCO.

Referring back to FIG. 4, the tuning signal circuitry (for example tuning signal circuitry 310 of FIG. 3) comprises a VCO simulation module 410 comprising at least one active component that is representative of an active component of the VCO 200, and arranged to generate the VCO simulation signal 415. For the illustrated example, the VCO simulation module 410 comprises an amplifier component 412 representative of the amplifier component 220 of the VCO 200 of FIG. 2, and is arranged to output as the VCO simulation signal 415 a voltage across the amplifier component 412. The VCO simulation module 410 of FIG. 4 further comprises a current source 414 that is operably coupled in series with the amplifier component 412 of the VCO simulation module 410. The current source 414 and amplifier component 412 of the simulation module 410 are representative of the current source 260 and amplifier component 220 of the VCO 200 of FIG. 2, and as such the voltage across the amplifier component 412 is representative of the voltage across the amplifier component 220 of the VCO. Significantly, because the current source 414 and amplifier component 412 of the simulation module 410 are representative of the current source 260 and amplifier component 220 of the VCO 200 of FIG. 2, they will be affected by variations in process, temperature, current consumption, oscillation frequency, etc. in the same manner as the current source 260 and amplifier component 220 of the VCO 200. Accordingly, such variations will be reflected in the VCO simulation signal 415.

In accordance with some examples, and as illustrated in FIG. 4, the amplifier component 412 of the VCO simulation module 410 may comprise a gain substantially equal to an $n^{th}$ of the gain of the amplifier component 220 of the VCO 200 of FIG. 2, and the current source 414 of the VCO simulation module 410 may provide a current substantially equal to an $n^{th}$ of the current provided by the current source 260 of the VCO 200. In this manner, the current consumption of the VCO simulation module 410 may be reduced, whilst maintaining the voltage across the amplifier component 412 as being representative of the voltage across the amplifier component 220 of the VCO.

For the illustrated example, the received target voltage signal 302 may be representative of a target voltage 245 across a variable capacitance 240 within the resonant tank circuit 210 of the VCO 200 of FIG. 2. Furthermore, the tuning signal circuitry 310 of the illustrated example may be arranged to output, as the tuning signal 315, the sum of the received target voltage signal 302 and the generated VCO simulation signal 415. Accordingly, the tuning signal 315 may be considered as comprising a first component representative of a target 'passive' voltage across the resonant tank circuit 210 of the VCO 200, and a second voltage component representative of an 'active' voltage across the amplifier component 220 of the VCO 200. Thus, for the example illustrated in FIG. 4, by configuring the current source 414 and amplifier component 412 to be representative of the current source 260 and amplifier component 220 of the VCO 200, a tuning signal 315 comprising an 'active' component that accurately reflects the voltage across the active components of the VCO 200 of FIG. 2 may be generated, with a 'passive' component that may be configured to comprise a target voltage level across the passive components of the VCO 200.

Figure 5:
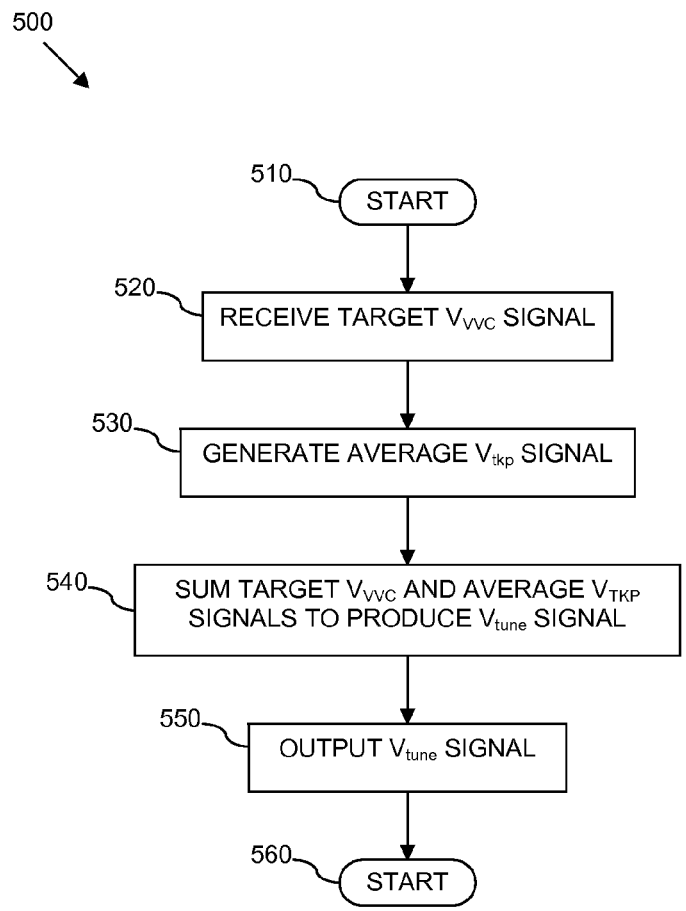
FIG. 5 illustrates an example of a simplified flowchart of a method for generating a tuning signal.

Referring now to FIG. 5, there is illustrated an example of a simplified flowchart 500 of a method for generating a tuning signal for calibrating a voltage controlled oscillator (VCO). The method starts at step 510, and moves on to step 520 with a receipt of a target voltage signal that is representative of a target voltage across at least one passive element within a resonant tank circuit of a VCO that is being calibrated. Next, at step 530, a VCO simulation signal that is representative of an average voltage difference across at least one passive element within a resonant tank circuit of a VCO that is being calibrated is generated. A sum of the received target voltage signal and generated VCO simulation signal are then produced at step 540. A tuning signal that is the sum of the received target voltage signal and the generated VCO simulation signal is output at step 550. The method then ends at step 560.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, in the example illustrated in FIG. 3, the calibration signal circuitry 310 is illustrated as being separate to configuration logic 370 for clarity. However, it will be appreciated that calibration signal circuitry adapted in accordance with some example embodiments of the present invention may alternatively form an integral part of configuration circuitry, such as the configuration logic 370 illustrated in FIG. 3.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device, such as illustrated in FIG. 3. Alternatively, the examples may be implemented as any number of separate integrated circuits or separate devices interconnected with each other in a suitable manner. For example, the calibration signal circuitry 310 of FIG. 3 may alternatively be implemented on a separate integrated circuit device to the VCO 200 and/or the configuration logic 370.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim 1ncludes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device comprising:
   tuning signal circuitry for generating a tuning signal for calibrating a voltage controlled oscillator (VCO), wherein the tuning signal circuitry is arranged to:
   receive a target voltage signal that is representative of a target voltage across a passive element within a resonant tank circuit of the VCO;
   generate a VCO simulation signal that is representative of an average voltage difference across a first active component of the VCO; and
   output the tuning signal based on the received target voltage signal and the generated VCO simulation signal; and
   a switching element operable to:
   couple the tuning signal to an input of the VCO in a calibration mode; and
   couple a control voltage signal to the input of the VCO in a phase-locked loop (PLL) mode.

2. The integrated circuit device of claim 1 wherein the tuning signal circuitry comprises a VCO simulation module comprising a second active component that is representative of the first active component of the VCO, and arranged to generate the VCO simulation signal.

3. The integrated circuit device of claim 2 wherein the VCO simulation signal is a voltage across an amplifier component.

4. The integrated circuit device of claim 3 wherein the VCO simulation module further comprises a current source that is operably coupled in series with the amplifier component of the VCO simulation module.

5. The integrated circuit of claim 4 wherein the current source and the amplifier component of the VCO simulation module are representative of a current source and the amplifier component.

6. The integrated circuit device of claim 4 wherein the amplifier component of the VCO simulation module comprises a gain equal to A/N, where A is the gain of the amplifier component of the VCO, and where N is an integer.

7. The integrated circuit of claim 4 wherein the current source of the VCO simulation module is arranged to provide a current equal I/N, where I is the current provided by the current source of the VCO, and where N is an integer.

8. The integrated circuit device of claim 1 wherein the target voltage signal is representative of a target voltage across a variable capacitance within the resonant tank circuit of the VCO.

9. The integrated circuit device of claim 1 wherein the target voltage signal is representative of a target voltage difference between a tuning input of the resonant tank circuit of the VCO and an output of the resonant tank circuit of the VCO.

10. The integrated circuit device of claim 1 wherein the tuning signal is a sum of the received target voltage signal and the generated VCO simulation signal.

11. A method for generating a tuning signal for calibrating a voltage controlled oscillator (VCO), the method comprising:
   receiving a target voltage signal that is representative of a target voltage across a passive element within a resonant tank circuit of the VCO;
   generating a VCO simulation signal representative of an average voltage difference across an active element within a resonant tank circuit of the VCO;
   outputting the tuning signal based on the received target voltage signal and the generated VCO simulation signal;
   coupling the tuning signal to an input of the VCO in a calibration mode; and
   coupling a control voltage signal to the input of the VCO in a phase-locked loop mode.

12. The integrated circuit device of claim 1 further comprising:
   the VCO.

13. The integrated circuit device of claim 12, wherein, when the integrated circuit device is in the PLL mode, the VCO provides an output to a PLL circuit.

14. The integrated circuit device of claim 13 further comprising:
   calibration logic arranged to receive the control voltage signal when the integrated circuit device is in the calibration mode.

15. The integrated circuit device of claim 14 wherein the calibration logic is further arranged to compare the control voltage signal to a target value when the integrated circuit device is in the calibration mode.

16. The integrated circuit device of claim 15 wherein the calibration logic includes a register arranged to store the target value.

17. The integrated circuit device of claim 15 wherein the calibration logic is further arranged to calibrate at least one of the PLL circuit and the VCO in response to comparing the control voltage signal to a target value.

18. The integrated circuit device of claim 17 wherein, in calibrating the at least one of the PLL circuit and the VCO, the calibration logic is further arranged to calibrate the at least one of the PLL circuit and the VCO such that the control voltage signal matches the target value.

19. The integrated circuit device of claim 17 wherein, in calibrating the at least one of the PLL circuit and the VCO, the calibration logic is further arranged to perform a course calibration of the at least one of the PLL circuit and the VCO whereby a frequency range is selected by configuring a divider in a feedback path of the PLL circuit.

20. The integrated circuit device of claim 19 wherein, in calibrating the at least one of the PLL circuit and the VCO, the calibration logic is further arranged to calibrate at least one of an inductance value and a capacitance value within the resonant tank circuit.

* * * * *